United States Patent [19]
Dixon et al.

[11] Patent Number: 5,568,443
[45] Date of Patent: Oct. 22, 1996

[54] COMBINATION DUAL-PORT RANDOM ACCESS MEMORY AND MULTIPLE FIRST-IN-FIRST-OUT (FIFO) BUFFER MEMORIES

[75] Inventors: R. Paul Dixon, Carrollton; Thanos Mentzelopoulos, Plano, both of Tex.

[73] Assignee: Smithills MultiMedia Systems, Inc., Plano, Tex.

[21] Appl. No.: 525,962

[22] Filed: Sep. 8, 1995

[51] Int. Cl.⁶ .................................. G11C 8/00; G11C 7/00
[52] U.S. Cl. .............................. 365/230.05; 365/189.02; 365/189.05; 365/230.08
[58] Field of Search .......................... 365/230.05, 189.02, 365/189.05, 230.08

[56] References Cited

U.S. PATENT DOCUMENTS 5,406,554  4/1995  Parry ................................... 365/189.01

Primary Examiner—David C. Nelms
Assistant Examiner—Trong Phan

Attorney, Agent, or Firm—Smith & Catlett, P.C.

[57] ABSTRACT

A data processor memory system that combines in a single memory array, a plurality of first-in-first-out (FIFO) buffer memories and a dual-port random access read-write memory (RAM). The memory array is divided into one region for the FIFO buffers and another region for the RAM memory. The memory system reads and writes data to the RAM region independently of the FIFO buffer region. The system enables access to the RAM memory by signals addressed to address fields within the RAM region, and enables access to the FIFO buffer memories by signals addressed to address fields within the FIFO region. The system writes data to each of the FIFO buffer memories utilizing an associated write pointer, and increments each write pointer when data is written to its associated FIFO buffer memory. The system reads data from each of the FIFO buffer memories utilizing an associated read pointer, and increments the read pointer when data is read from its associated FIFO buffer memory. The write pointers and the read pointers roll-over to a first address in their associated FIFO buffers when each pointer reaches the top of addressable memory in its associated FIFO buffer memory.

20 Claims, 2 Drawing Sheets

COMBINATION DUAL-PORT RANDOM ACCESS MEMORY AND MULTIPLE FIRST-IN-FIRST-OUT (FIFO) BUFFER MEMORIES

BACKGROUND OF THE INVENTION

Technical Field of the Invention

This invention relates to data processor memory systems and, more particularly, to a memory device which combines a dual-port random access memory with multiple first-in-first-out (FIFO) buffer memories.

Description of Related Art

A dual-port random access memory (RAM) allows simultaneous read/write access from two independent ports. A first-in-first-out (FIFO) memory is a buffer memory with an input port and an output port in which data becomes available to the output port in the same order as it was presented to the input port. In many processor and microprocessor designs, there is a requirement for a combination of some general purpose random access read/write memory along with one or more FIFO buffer memories. In addition, a number of factors, such as cost, power consumption, and board space make it desirable to implement a solution with a single RAM array.

The problem with existing random access memory systems is they do not easily provide for a single memory array which serves as a combination of a general purpose random access read/write memory along with one or more FIFO buffer memories. Utilizing existing solutions, such a combination would be implemented as entirely separate memory systems or perhaps as a single memory system utilizing multiple random access memory arrays. Both of these solutions, however, suffer from several disadvantages, including higher system cost, ;increased power consumption and utilization of additional valuable board area.

In order to overcome the disadvantage of existing solutions, it would be advantageous to have a memory system that provides both a number of first-in-first-out (FIFO) buffers as well as a general purpose dual-ported read/write memory while utilizing only a single random access memory array. The present invention provides such a memory system.

SUMMARY OF THE INVENTION

In one aspect, the present invention is a system for combining in a single memory array, a plurality of FIFO buffer memories and a dual-port random access read/write memory. The memory system comprises a memory array that includes a first region of the memory array that operates as a random access memory (RAM) device, and a second region of the memory array that operates as a plurality of independent first-in-first-out (FIFO) buffer memories. The system includes means writing data to, and: reading data from, the first region independently of the second region. The system also includes means for writing data to, and reading data from, the second region independently of the first region.

In another aspect, the present invention is a method of partitioning a single memory array into a plurality of first-in-first-out (FIFO) buffer memories and a region of random access read/write (RAM) memory. The method comprises the steps of designating a first region of the memory array for the RAM memory, and designating a second region of the memory array for the plurality of FIFO buffer memories. Thereafter, the method enables access to the RAM memory by signals addressed to address fields within the first region, and enables access to the FIFO buffer memories by signals addressed to address fields within the second region. The method may further comprise the steps of writing data to each of the plurality of FIFO buffer memories utilizing a separate write pointer for each FIFO buffer, incrementing each write pointer when data is written to its associated FIFO buffer memory, reading data from each of the plurality of FIFO buffer memories utilizing a separate read pointer for each FIFO buffer, incrementing each read pointer when data is read from its associated FIFO buffer memory, rolling over each write pointer to a first address in its associated FIFO buffer when the write pointer reaches the top of addressable memory in its associated FIFO buffer memory, and rolling over each read pointer to a first address in its associated FIFO buffer when the read pointer reaches the top of addressable memory in its associated FIFO buffer memory.

BRIEF DESCRIPTION OF THE DRAWINGS

The invention will be better understood and its numerous objects and advantages will become more apparent to those skilled in the art by reference to the following drawing, in conjunction with the accompanying specification, in which.

DETAILED DESCRIPTION OF EMBODIMENTS

Figure 1:
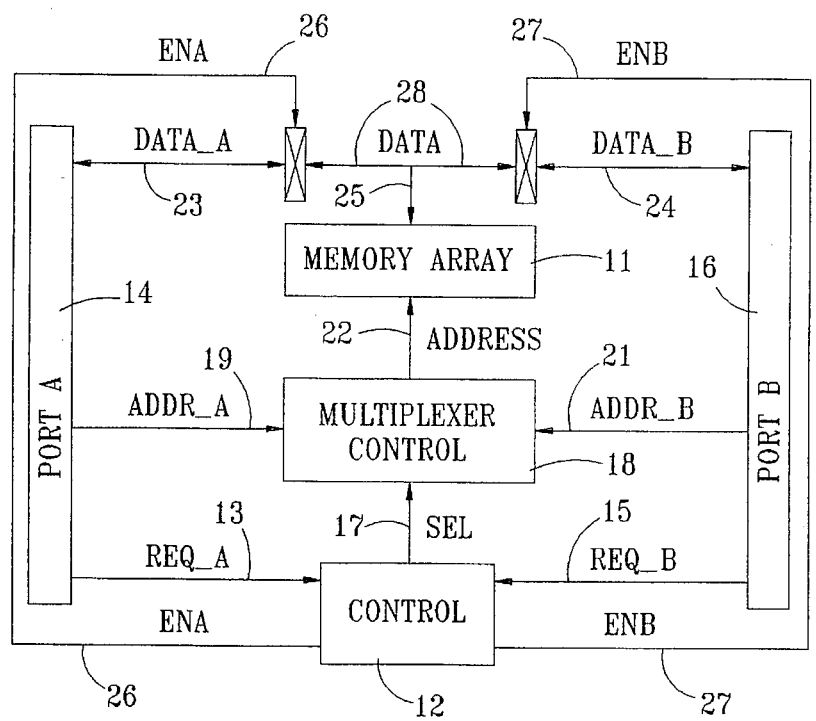
FIG. 1 (Prior Art) is a block diagram of an existing memory configuration in which a single random access memory array is used as a dual port random access memory (RAM)

FIG. 1 (Prior Art) is a block diagram of an existing memory configuration in which a single random access memory array 11 is used as a dual port random access memory (RAM). Requests for access are signaled to a Control block 12 using a REQ_A signal 13 from Port A 14 and a REQ_B signal 15 from Port B 16. The Control block prioritizes the requests 13 and 15, selects a port (A or B), and grants access to the memory array 11. The Control block 12 sends a SEL signal 17 to a Multiplexer 18 notifying the Multiplexer of the selected port. The Multiplexer 18 then enables either an ADDR_A signal 19 or an ADDR_B signal 21 from the selected port to be sent as an address signal. 22 to the memory array 11. The Control block 12 also enables a DATA_A signal 23 and a DATA_B signal 24 in order to open a data transfer path 25 between the selected port and the memory array 11 by asserting ENA 26 or ENB 27 for ports A and B respectively. This configuration also allows for data to flow from Port A 14 to Port B 16 and vice-versa through data transfer path 28 without being stored in the memory array 11 if both ENA and ENB are asserted concurrently. This may be used for diagnostic purposes or any other direct communication.

Figure 2:
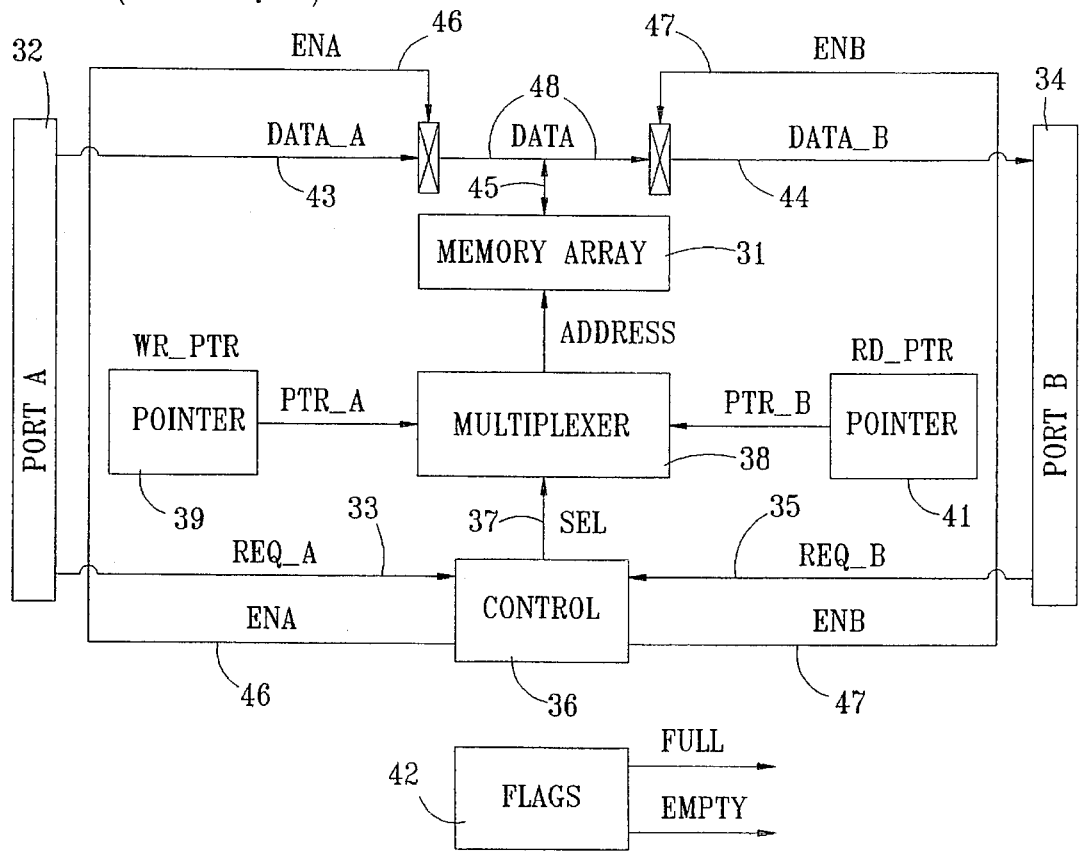
FIG. 2 (Prior Art) is a block diagram of an existing memory configuration in which a single random access memory array is used as a first-in-first-out (FIFO) buffer memory.

FIG. 2 (Prior Art) is a block diagram of an existing memory configuration in which a single random access memory array is used as a first-in-first-out (FIFO) buffer memory array 31. Requests to add data to the FIFO buffer memory array 31 are carried from an Input Port A 32 by a REQ_A signal 33. Requests to remove data from the FIFO buffer memory array are carried from an Output Port B 34 by a REQ_B signal 35. A Control block 36 arbitrates between requests to add data and requests to remove data from the memory array 31, and grants access to one of the two functions at any moment in time. The Control block 36 sends a SEL signal 37 to a Multiplexer 38 notifying the Multiplexer of the selected function. Two address holding registers/counters, a write pointer (WR_PTR) 39 and a read pointer (RD_PTR) 41 are utilized to implement a circular buffer within the memory array 31. When data is being added to the FIFO buffer memory array, the data is written into the memory array at the address pointed to by WR_PTR 39. WR_PTR is then incremented. When WR_PTR reaches the top of addressable memory in the memory array 31, it 'rolls-over' to the first address in memory. When data is removed from the FIFO buffer memory array, it is read from the address pointed to by RD_PTR 41. RD_PTR is then incremented. When RD_PTR reaches the top of addressable memory in the memory array 31, it also 'rolls-over' to the first address in memory. When the WR_PTR 39 is pointing to the same location in memory as the RD_PTR 41, the FIFO buffer memory array 31 is either FULL or EMPTY. As is well known in the art, a Flags block 42 contains the necessary logic to determine whether the array is FULL or EMPTY whenever the WR_PTR 39 is pointing to the same location in memory as the RD_PTR 41.

In the same manner as described in relation to FIG. 1, the Control block 36 also enables a DATA_A signal 43 and a DATA_B signal 44 in order to open a data transfer path 45 between the selected port and the memory array 31 by asserting ENA 46 or ENB 47 for Ports A and B respectively. This configuration also allows for data to flow from Input Port A 32 to Output Port B 34 through data transfer path 48 without being stored in the memory array 31 if both ENA and ENB are asserted concurrently.

Whenever a binary (i.e., $2^n$ where n=an integer greater than or equal to zero) number of equal sized FIFO buffers are implemented along with a separate region of random access read/write memory, the address space cannot be divided on the basis of a simple decoding of address bits. To overcome this, the memory may, conceptually, be arbitrarily divided into any number of binary sized pages, where the page size may be as small as the entity of access, for example, a 32-bit word. Typically, however, a larger page size, for example 1 Kbyte, may prove more convenient. In configurations in which the memory is implemented using dynamic random access memory (DRAM), it may be more advantageous to set the page size to be at least as large as the quantity of data that may be recovered from a single row. This page size then allows advantage to be taken of burst access modes to increase the available bandwidth.

A contiguous set of pages may be allocated from within the address space of the memory array to be used as the random access read/write memory block described above. The allocation of a contiguous set of pages ensures that a defined set of page addresses are reserved for the random access read/write memory block. The number of pages that may be allocated to the random access read/write memory block is an integer multiple of the number of FIFO buffers being implemented in the array. Those pages allocated to the random access read/write memory block are not utilized by any of the FIFO buffers.

The random access read/write memory block has a start address. Careful allocation of the start address for a random access read/write memory block of any given size may serve to ensure that a minimum number of address bits are involved in the process of determining whether a memory address refers to the random access read/write memory block or to a FIFO buffer. The most convenient such allocation is to cause the random access read/write memory block to start at offset 'zero' into the memory array.

Whenever the number of pages allocated to the random access read/write memory block is a binary number, a constant field from a set of the most significant address bits may be utilized to define the random access read/write memory block. Since the pages allocated to the random access read/write memory block are not utilized by any of the FIFO buffers, the constant field defines a value for a portion of the address field that must be omitted from the addresses allocated to any of the FIFO buffers.

It is not essential to the operation of the present invention that the number of pages allocated to the random access read/write memory block be a binary number. The present invention teaches that the number of pages is an integer multiple of the number of FIFO buffers. The consequence of selecting a non-binary number of pages is that a number of fields of address bits, each of which refers to a binary block of pages, must be reserved for the random access read/write memory block.

The address counters for the FIFO read and write pointers are made to skip the reserved value(s) of the random access read/write memory block as the pointers increment. This omitted range of addresses are also taken into consideration when calculating the status of the empty and full flags and any other flags that may be required for the operation of the FIFO buffer.

If a binary number of FIFO buffers are implemented, then an appropriate number of address bits are allocated to represent which FIFO buffer is the subject of the reference. This is most easily achieved in a manner that does not conflict with the reserved address field for the random access read/write memory by selecting the FIFO address bits to fall, in the order of significance, between the least significant bit in the previously defined field for the random access read/write memory and the most significant bit defined for the arbitrarily selected page size.

Access to the random access read/write memory block presents one of the valid values for the reserved address field along with any arbitrary value for the address bits of lower significance. Access to a FIFO buffer involves a fixed value to the FIFO select field along with the value from the appropriate FIFO pointer register providing the remainder of the address bits. It should be noted that the count sequence within the FIFO pointers is adjusted to ensure that the selected value(s) of the reserved field for the random access read/write memory block is never generated when any FIFO buffer is being referenced.

Figure 3:
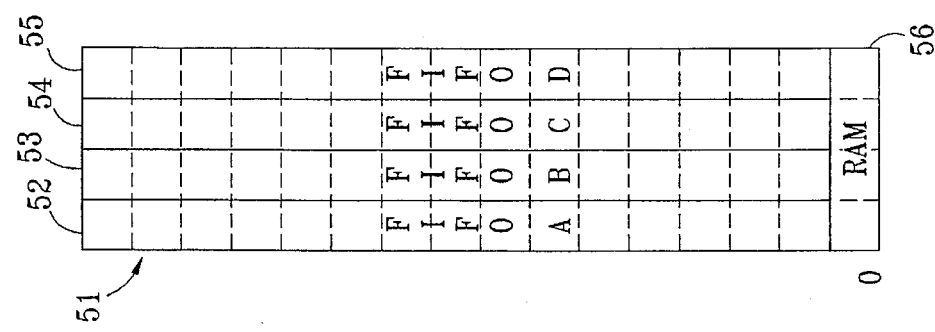
FIG. 3 is an illustrative drawing of a random access memory array partitioned into four FIFO buffer memories and a dual-ported random access read/write memory block in accordance with the teachings of the present invention.

FIG. 3 is an illustrative drawing of a random access memory array 51 partitioned into four FIFO buffer memories (FIFO A through FIFO D) 52–55 and a dual-ported random access read/write memory block 56 in accordance with the teachings of the present invention. In the preferred embodiment, the memory array 51 comprises a 1-Mbyte block of DRAM organized as a 256K×32-bit RAM array. The random access read/write memory block 56 is located within the array and is 64 Kbytes in size. Also located within the array are the four independent FIFO buffers 52–55, each of which is 240 Kbytes in size. In the following illustration, bit 0 is the least significant bit within an address pointer.

Twenty address bits, A[19 . . . 0], are required to index into the 1 Mbyte block of memory 51. The lowest 64 Kbytes are assigned as the random access read/write memory block 56, requiring sixteen address bits, A[15 . . . 0], to index into this region. The value reserved for the most significant address bits, A[19 . . . 16], for the random access read/write memory block is that all address bits, A[19 . . . 16], have the value 'zero'. This reserved value is not used for any access that is performed to one of the FIFO buffers 52–55.

Each of the FIFO buffers 52–55 has a pair of 16-bit pointers, one designated the write pointer, WP[15 . . . 0], the other, the read pointer, RP[15 . . . 0]. This is sufficient to define a 32-bit word access address into each FIFO buffer. All data access in the preferred embodiment is performed in units of a 32-bit word, although individual byte enables are presented during access to the random access read/write memory block to ensure that true byte access is available.

When a 32-bit data word is accepted by one of the FIFO buffers for storage, the write pointer is used as a source of address for the write operation. Following the write operation, the write pointer is incremented in preparation liar any subsequent write operation. If, following the increment of the write pointer, the write pointer has the same value as the read pointer, then the FIFO buffer is marked as FULL, and no further data is accepted for storage until such time as a read operation has been performed to remove a data item from the FIFO buffer.

The incrementing process for the FIFO pointers is the same for both read and write pointers and is as follows. Unless the pointer has reached the end of its count and contains the maximum value, one (1) is added to the pointer to cause it to advance by one. The maximum value is a function of the size of the memory block 51 and the number of individual FIFO buffers being implemented in that block. For the 1-Mbyte size of the memory array and the four FIFO buffers in the preferred embodiment, the maximum value of the FIFO pointer before 'roll-over' occurs is FFFFH.

Whenever a pointer containing the maximum value is incremented, the counter rolls-over. In configurations implementing only FIFO buffers, the counter would return to the value 0000H. However, in the combined solution described herein, to assume a 'zero' value would lead to a conflict with the addresses allocated to the random access read/write memory block 56. Therefore, a non-zero value is loaded as the pointer rolls-over. The non-zero value is a function of the size of address space allocated to the random access read/ write memory block, and directs the pointer back to the beginning of the memory space allocated to the FIFO buffers. For the chosen size of 64 Kbytes, the non-zero value is 1000H.

When data is retrieved from one of the FIFO buffers, the read pointer is used as a source of the address for the read operation. Following the read operation, the read pointer is incremented in preparation for any subsequent read operation. If, following the increment of the read pointer, it is found to have the same value as the write pointer, then the FIFO buffer is marked as EMPTY, and no further request for data retrieval is accepted until such time as a write operation has been performed to add another data item to the FIFO buffer.

When either a read or a write operation is performed on a FIFO buffer, the appropriate pointer, xP[15 . . . 0], is applied as follows to create an index address into the RAM. Pointer bits, xP[15 . . . 12], are applied to address bits A[19 . . . 16.]. This assignment along with the non-zero load applied to the pointers ensures that the reserved field for the random access read/write memory region is never applied. Address bits, A[15 . . . 14], are used to identify which of the four implemented FIFO buffers is being accessed. The remaining twelve bits of pointer, xP[11 . . . 0], are applied to address bits A[13 . . . 2]. Since in this embodiment, both the read and the write access to the FIFO buffer are performed as a 32-bit word, no assignment to address bits, A[1 . . . 0], is necessary.

Although page sizes may vary, in the preferred embodiment, the page size is 16 Kbytes. This allows advantaged to be taken of burst mode capabilities of DRAMs. The total memory array 51 then consists of 64 pages of 16 Kbytes each. The memory may now be viewed as a 4×16 matrix of pages which may be assembled as in FIG. 3 with the page with the lowest address at the bottom left, followed to the right by three more pages, each with succeedingly higher addresses. The page with the next highest address is placed on the top of the left hand column and the next three pages are placed in sequence to the right. This process is repeated until the matrix is complete.

The resulting matrix is then partitioned as illustrated in FIG. 3 to define the random access read/write memory block 56 as four pages in a single horizontal foxy, while each of the FIFO buffers becomes a single vertical column of 15 pages with the lowest page in the column excluded and assigned to the random access read/write memory block. The array thus performs divisions in two axes, since the RAM region 56 is horizontal, and the FIFO buffers 52–55 are vertical.

Figure 4:
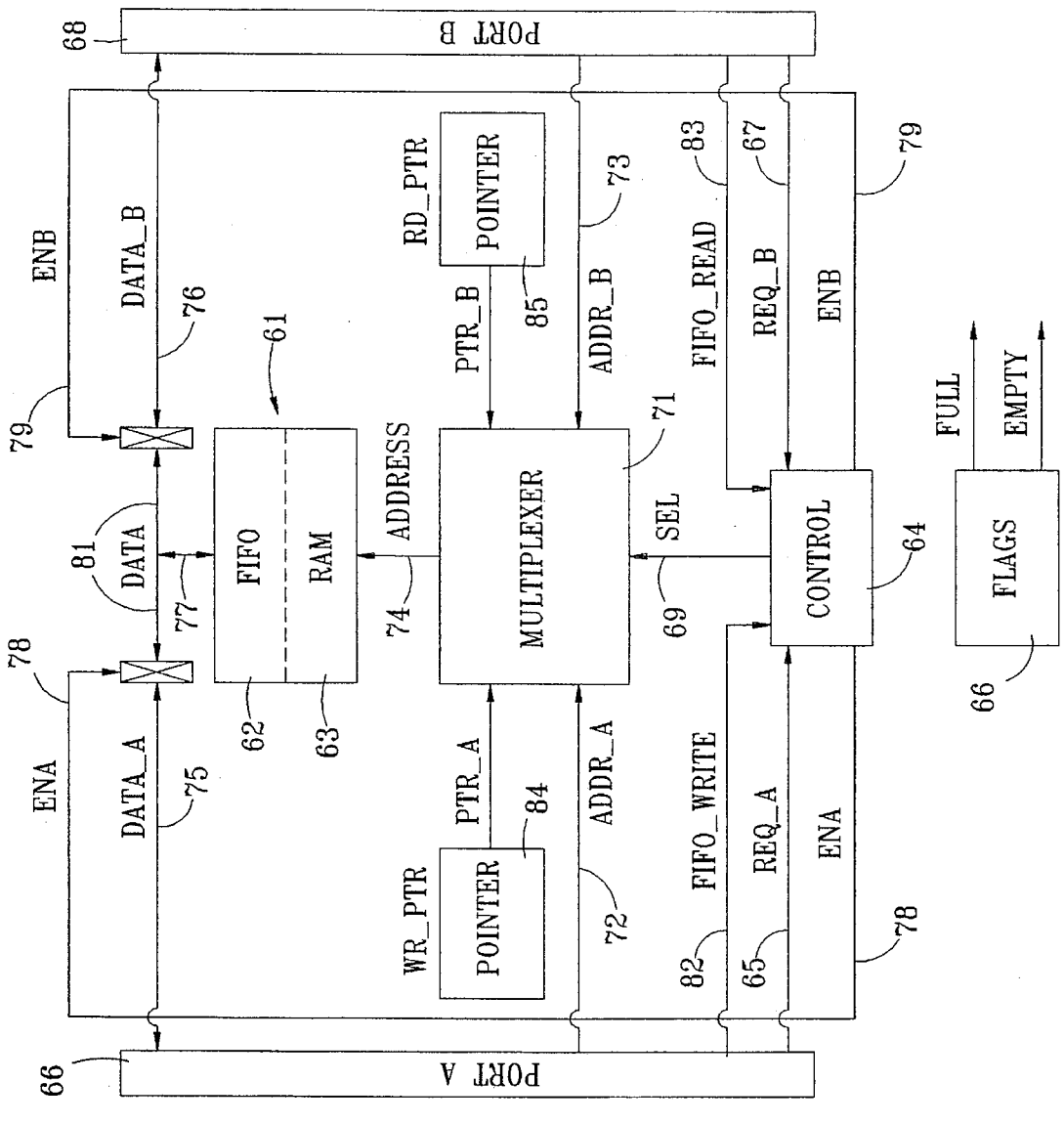
FIG. 4 is a block diagram of the preferred embodiment of a memory system that provides both a general purpose dual-ported read/write memory along with one or more first-in-first-out (FIFO) buffers while utilizing only a single random access memory array.

Referring now to FIG. 4, there is shown a block diagram of the preferred embodiment of a memory system that provides both a general purpose dual-ported read/write RAM memory along with one or more first-in-first-out (FIFO) buffers while utilizing only a single memory array 61. The memory array 61 is configured with a FIFO buffer memory region 62 and a RAM memory region 63. For the general purpose dual-ported read/write RAM memory region 63, requests for access are signaled to a Control block 64 using a REQ_A signal 65 from Port A 66 and a REQ_B signal 67 from Port B 68. The Control block prioritizes the requests 65 and 67, selects Port A 66 or Port B 68, and grants access to the memory array 61. The Control block 64 sends a SEL signal 69 to a Multiplexer 71 notifying the Multiplexer of the selected port. The Multiplexer 71 then enables either an ADDR_A signal 72 or an ADDR_B signal 73 from the selected port to be sent as an address signal 74 to the memory array 61. The address signal 74 includes an address within the RAM region 63 of the memory array 61. The Control block 64 also enables a DATA_A signal 75 and a DATA_B signal 76 in order to open a data transfer path 77 between the selected port and the memory array 61 by asserting ENA 78 or ENB 79 for Ports A and B respectively. This configuration also allows for data to flow from Port A 66 to Port B 68 and vice-versa through data transfer path 81 without being stored in the memory array 61 if both ENA and ENB are asserted concurrently.

For the first-in-first-out (FIFO) buffer memory region 62, requests to add data to the FIFO buffer memory 62 are carried by a FIFO_WRITE signal 82. The FIFO_WRITE signal 82 includes an indicator that identifies the particular FIFO buffer 52–55 (FIG. 3) to which the data is to be written. Requests to remove data from the FIFO buffer memory 62 are carried by a FIFO_READ signal 83. The FIFO_READ signal 83 includes an indicator that identifies the particular FIFO buffer 52–55 (FIG. 3) from which the data is to be read. The Control block 64 arbitrates between requests to add data and requests to remove data from the FIFO buffer memory array 62, and grants access to one of the two functions at any moment in time. The Control block 64 sends the SEL signal 69 to the Multiplexer 71 notifying the Multiplexer of the selected function and identifying a selected FIFO buffer memory. Two address holding registers/counters for each FIFO buffer memory, a write pointer (WR_PTR) 84 and a read pointer (RD_PTR) 85 are utilized to implement a circular buffer within each FIFO buffer memory in region 62. When data is being added to a FIFO buffer memory in region 62, the data is written into the memory array at the address pointed to by the WR_PTR 84 associated with that particular FIFO buffer. WR_PTR is then incremented. When WR_PTR reaches the top of addressable memory in its associated FIFO buffer, it 'rolls-over' to the first address in its associated FIFO buffer following the RAM memory region 63. When data is removed from a FIFO buffer memory in region 62, it is read from the address pointed to by the RD_PTR 85 associated with that particular FIFO buffer. RD_PTR is then incremented. When RD_PTR reaches the top of addressable memory in its associated FIFO buffer, it also 'rolls-over' to the first address in its associated FIFO buffer following the RAM memory region 63. When the WR_PTR 84 is pointing to the same location in memory as the RD_PTR 85, the FIFO buffer memory region 62 of the memory array 61 is either FULL or EMPTY. As is well known in the art, the Flags block 86 contains the necessary logic to determine whether the array is FULL or EMPTY whenever the WR_PTR 84 is pointing to the same location in memory as the RD_PTR 85.

It is thus believed that the operation and construction of the present invention will be apparent from the foregoing description. While the method, apparatus and system shown and described has been characterized as being preferred, it will be readily apparent that various changes and modifications could be made therein without departing from the spirit and scope of the invention as defined in the following claims.

What is claimed is:

1. A memory system for storing data, said memory system comprising:

a memory array comprising:
   a first region of said memory array that operates as a random access memory (RAM) device; and
   a second region of said memory array that operates as a plurality of independent first-in-first-out (FIFO) buffer memories;

means for writing data to said first region and reading data from said first region independently of said second region; and means for writing data to said second region and reading data from said second region independently of said first region.

2. The memory system of claim 1 wherein said first region and said second region of said memory array each comprise a plurality of memory pages.

3. The memory system of claim 2 wherein said first region of said memory array operates as a dual-port random access memory array.

4. The memory system of claim 2 wherein said plurality of independent FIFO buffer memories comprises $2^n$ independent FIFO buffer memories.

5. The memory system of claim 4 wherein said means for writing data to said first region and reading data from said first region includes a control block that prioritizes requests for access to said first region, selects a port for access, and grants access to said first region of said memory array.

6. The memory system of claim 5 wherein said means for writing data to said first region and reading data from said first region includes a multiplexer that enables an address signal from the selected port to be sent to said first region of said memory array.

7. The memory system of claim 6 wherein said control block includes means for opening a data transfer path between said selected port and said first region of said memory array.

8. The memory system of claim 4 wherein said means for writing data to said second region and reading data from said second region includes:
   a FIFO_WRITE signal that requests to add data to said second region; and
   a FIFO_READ signal that requests to read data from said second region.

9. The memory system of claim 8 wherein said FIFO_WRITE signal includes an indicator that identifies a particular one of said plurality of FIFO buffer memories to which data is to be added.

10. The memory system of claim 9 wherein said FIFO_READ signal includes an indicator that identifies a particular one of said plurality of FIFO buffer memories from which data is to be read.

11. The memory system of claim 10 wherein said means for writing data to said second region and reading data from said second region includes a control block that arbitrates between said FIFO_WRITE signals and said FIFO_READ signals, selects one of said signals for access to said second region, and grants access to said selected signal to said second region of said memory array.

12. The memory system of claim 11 wherein said means for writing data to said second region and reading data from said second region includes means for implementing a circular buffer within said second region of said memory array.

13. The memory system of claim 12 wherein said means for implementing a circular buffer within said second region of said memory array includes a write pointer that increments through addresses in said second region when data is written to said second region and rolls-over to a first address in said second region when said write pointer reaches the top of addressable memory of said memory array.

14. The memory system of claim 13 wherein said means for implementing a circular buffer within said second region of said memory array includes a read pointer that increments through addresses in said second region when data is read from said second region and rolls-over to a first address in said second region when said read pointer reaches the top of addressable memory of said memory array.

15. A method of partitioning a single memory array into a plurality of first-in-first-out (FIFO) buffer memories and a region of random access read/write (RAM) memory, said method comprising the steps of:

designating a first region of said memory array for said RAM memory;

designating a second region of said memory array for said plurality of FIFO buffer memories;

enabling access to said RAM memory by signals addressed to address fields within said first region; and enabling access to said FIFO buffer memories by signals addressed to address fields within said second region.

16. The method of partitioning a single memory array of claim 15 further comprising the steps of:
dividing said first region of said memory array into a plurality of pages;
orienting said pages of said first region in a horizontal row;
dividing said second region of said memory array into a plurality of pages; and
orienting said pages of said second region in a vertical row for each of said plurality of FIFO buffer memories.

17. The method of partitioning a single memory array of claim 16 wherein said step of enabling access to said FIFO buffer memories by signals addressed to address fields within said second region includes the steps of:
arbitrating between requests to add data and requests to remove data from said second region; and
granting access to one of said requests at any moment in time.

18. The method of partitioning a single memory array of claim 17 wherein said step of enabling access to said FIFO buffer memories by signals addressed to address fields within said second region includes implementing a circular buffer within each of said plurality of FIFO buffer memories.

19. The method of partitioning a single memory array of claim 18 wherein said step of enabling access to said FIFO buffer memories by signals addressed to address fields within said second region includes associating a separate write pointer with each of said plurality of FIFO buffer memories by including a FIFO select field in address signals sent to said memory array.

20. The method of partitioning a single memory array of claim 19 wherein said step of implementing a circular buffer within each of said plurality of FIFO buffer memories includes the steps of:
writing data to each of said plurality of FIFO buffer memories utilizing its associated write pointer;
incrementing each of said write pointers when data is written to its associated FIFO buffer memory;
reading data from each of said plurality of FIFO buffer memories utilizing its associated read pointer;
incrementing each of said read pointers when data is read from its associated FIFO buffer memory;
rolling over each of said write pointers to a first address in its associated FIFO buffer memory when said write pointer reaches the top of addressable memory in its associated FIFO buffer memory; and
rolling over each of said read pointers to a first address in its associated FIFO buffer memory when said read pointer reaches the top of addressable memory in its associated FIFO buffer memory.

* * * * *